US008093092B2

(12) United States Patent
Singh et al.

(10) Patent No.: US 8,093,092 B2
(45) Date of Patent: Jan. 10, 2012

(54) TECHNIQUES FOR GLASS ATTACHMENT IN AN IMAGE SENSOR PACKAGE

(75) Inventors: Harpuneet Singh, Dublin, CA (US); Liqun Larry Wang, Palo Alto, CA (US); Tic Medina, Hayward, CA (US)

(73) Assignee: Flextronics AP, LLC, Broomfield, CO (US)

( * ) Notice: Subject to any disclaimer, the term of this patent is extended or adjusted under 35 U.S.C. 154(b) by 184 days.

(21) Appl. No.: 12/502,924

(22) Filed: Jul. 14, 2009

(65) Prior Publication Data

US 2010/0105160 A1 Apr. 29, 2010

Related U.S. Application Data

(63) Continuation of application No. 12/343,985, filed on Dec. 24, 2008, now abandoned, which is a continuation-in-part of application No. 12/136,033, filed on Jun. 9, 2008, now abandoned.

(60) Provisional application No. 60/942,953, filed on Jun. 8, 2007.

(51) Int. Cl.
*H01L 21/00* (2006.01)
*H01L 21/50* (2006.01)
*H01L 21/48* (2006.01)
*H01L 21/44* (2006.01)

(52) U.S. Cl. .......... 438/66; 438/107; 438/110; 438/113; 438/E21.499

(58) Field of Classification Search ............ 438/66, 438/107, 110, 113; 257/E21.499
See application file for complete search history.

(56) References Cited

U.S. PATENT DOCUMENTS

| 6,285,064 B1 | 9/2001 | Foster |
| 6,566,745 B1 | 5/2003 | Beyne et al. |
| 6,777,767 B2 | 8/2004 | Badehi |
| 6,995,462 B2* | 2/2006 | Bolken et al. ............ 257/680 |
| 7,378,724 B2* | 5/2008 | Yu et al. .................. 257/685 |
| 7,433,555 B2* | 10/2008 | Lee et al. .................. 385/14 |
| 7,901,973 B2* | 3/2011 | Yamamoto ............... 438/65 |
| 2005/0242409 A1 | 11/2005 | Yang et al. |
| 2005/0253213 A1 | 11/2005 | Jiang et al. |
| 2006/0024857 A1 | 2/2006 | Chen et al. |
| 2006/0073630 A1 | 4/2006 | Liu |
| 2009/0267170 A1* | 10/2009 | Chien et al. ............. 257/434 |

* cited by examiner

*Primary Examiner* — Luan C Thai
(74) *Attorney, Agent, or Firm* — Robert G. Crouch; Marsh Fischmann & Breyfogle LLP

(57) ABSTRACT

A low-cost wafer-level packaging (WLP) method for attaching glass to optical image-sensor devices on a semiconductor wafer in order to increase the yield of image-sensor modules during later steps of assembly. One embodiment relates to applications with image-sensors (and microlenses) fabricated on a wafer. A glass wafer is singulated, aligned to mirror the die pattern on an image-sensor wafer, and then bonded to the image-sensor wafer such that optical adhesive forms a layer between the each image-sensor and its glass cover. Another embodiment applies cavity walls to singulated glass covers, which are then attached to image sensors which may be formed on a single wafer. The wafer can then be singulated and a plurality of image sensor packages is formed.

31 Claims, 13 Drawing Sheets

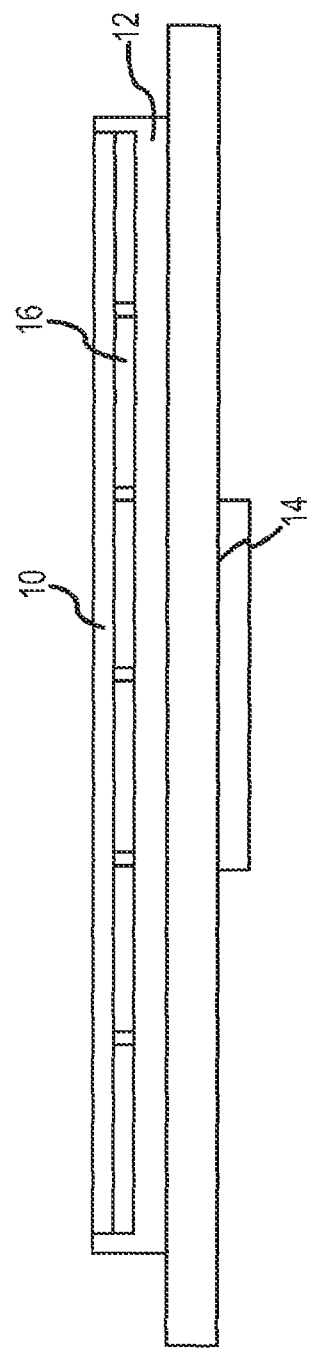
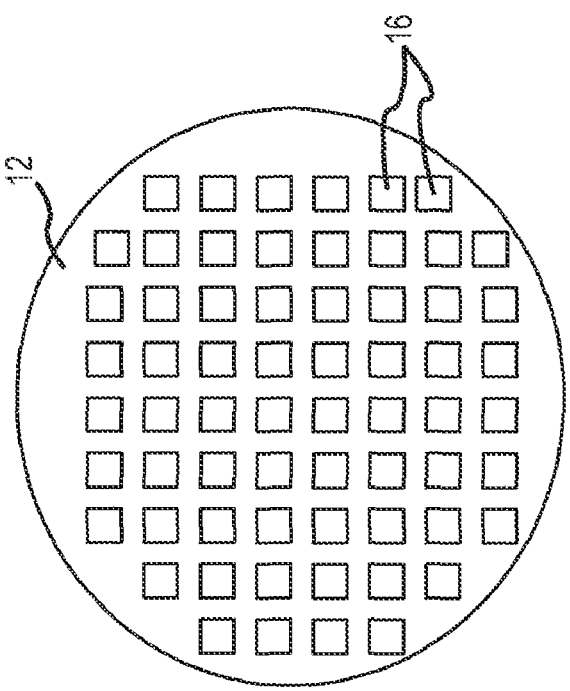
FIG.1A
FIG.1B

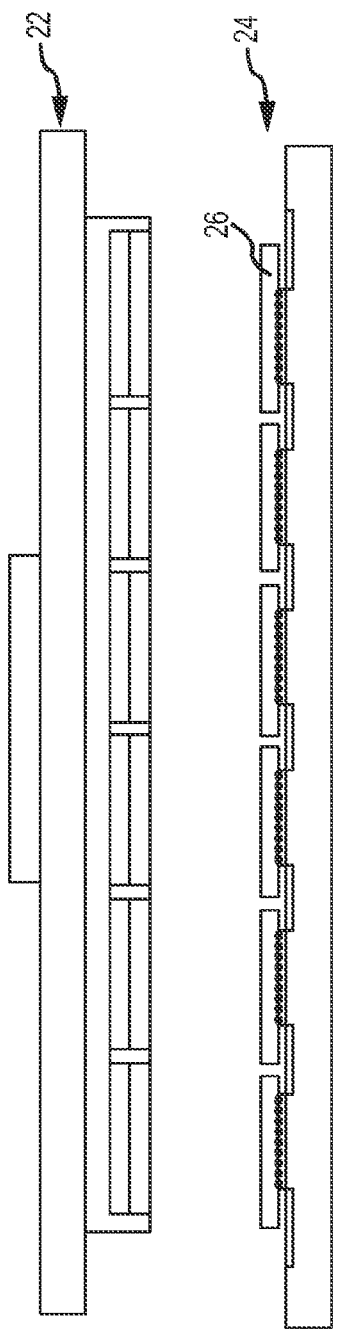
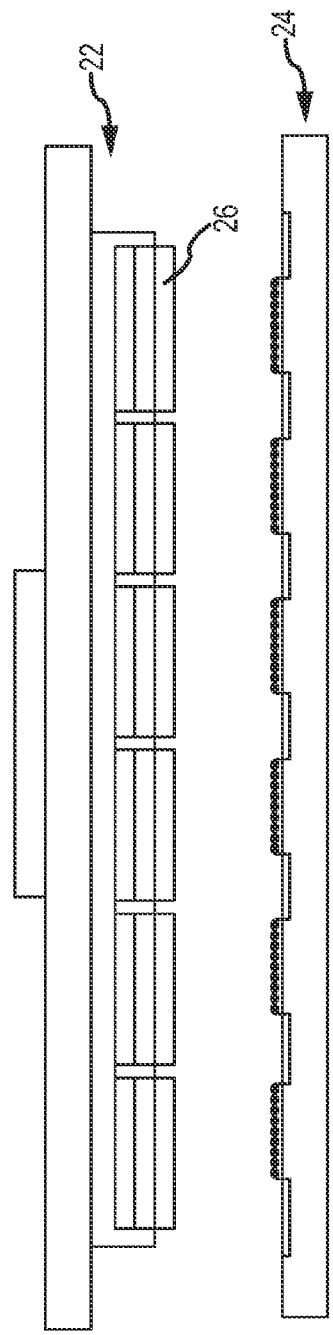
FIG.3A
FIG.3B

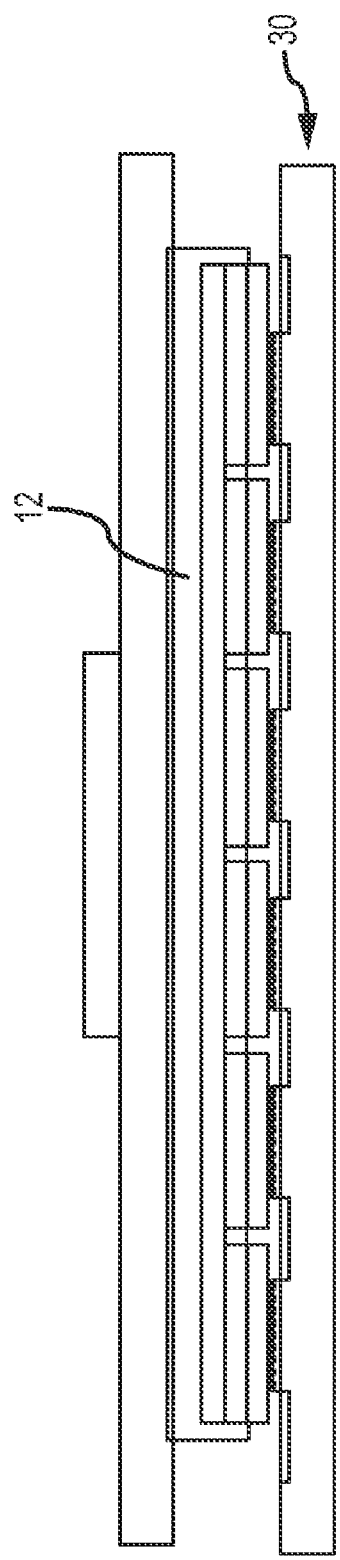

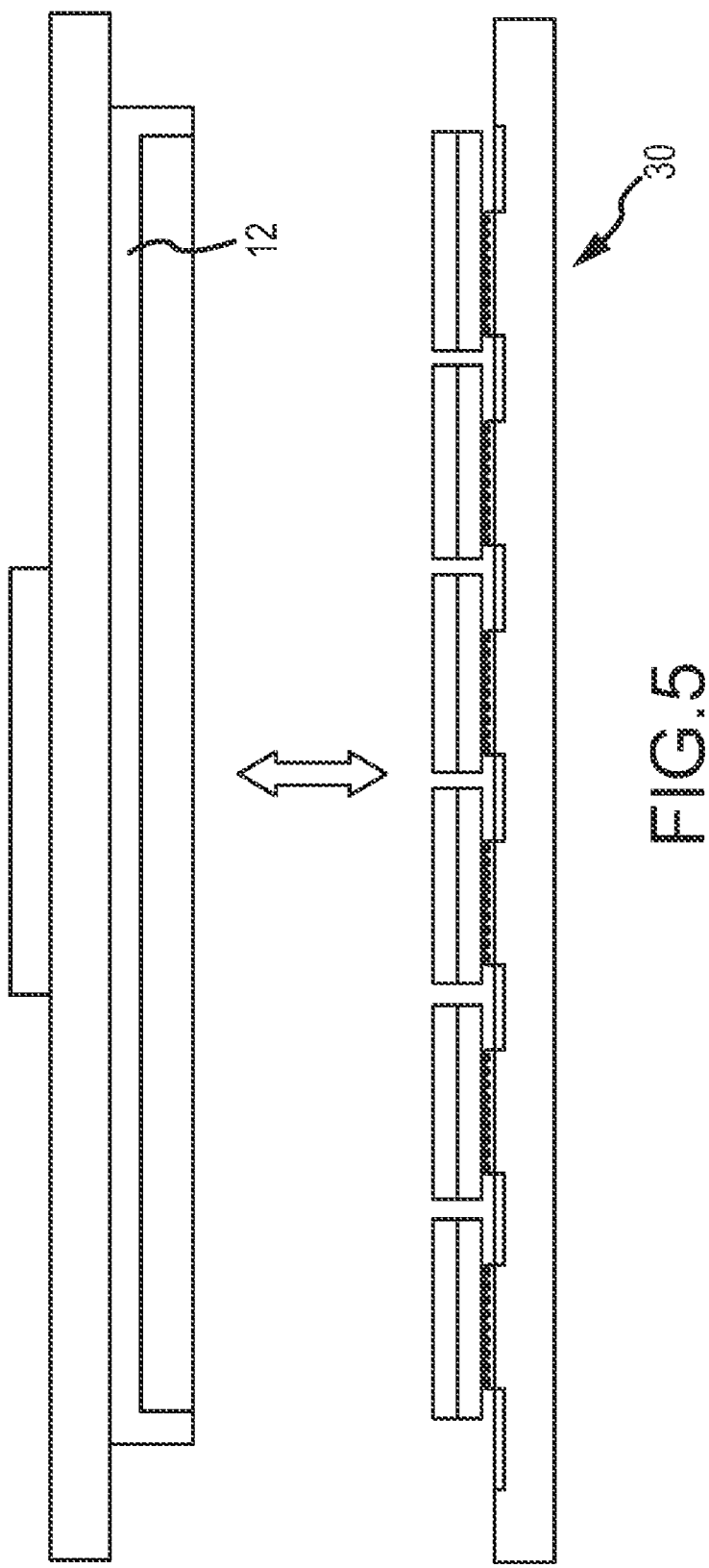

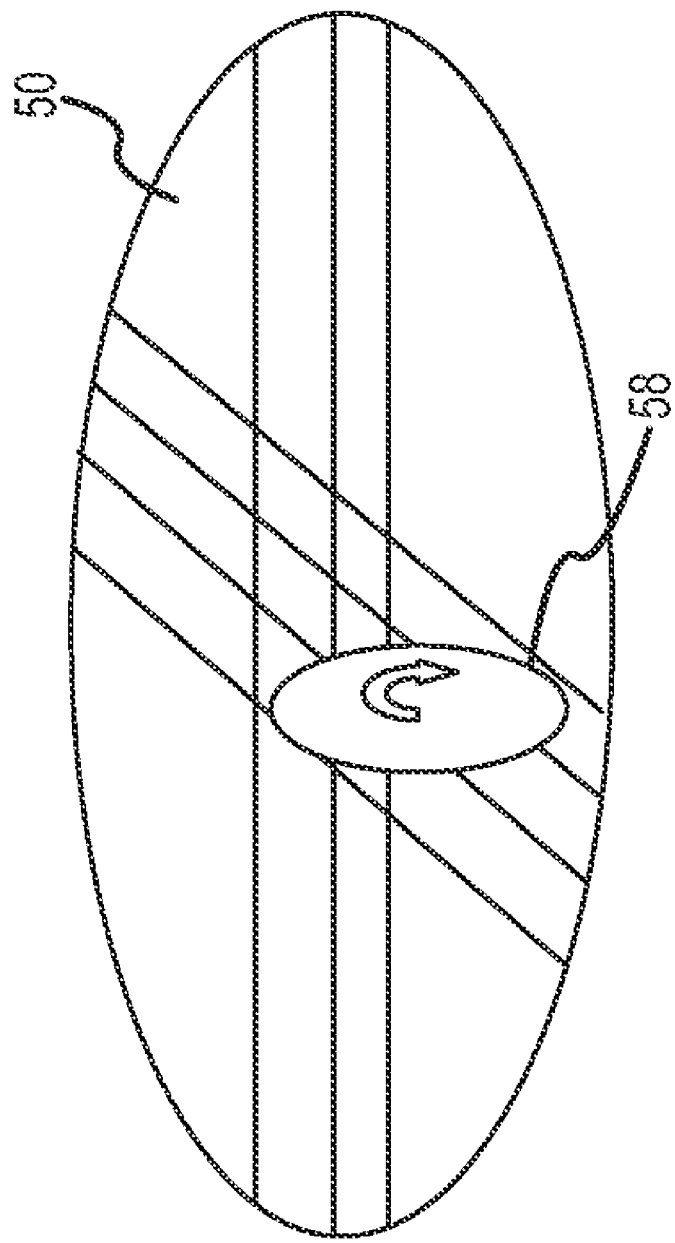

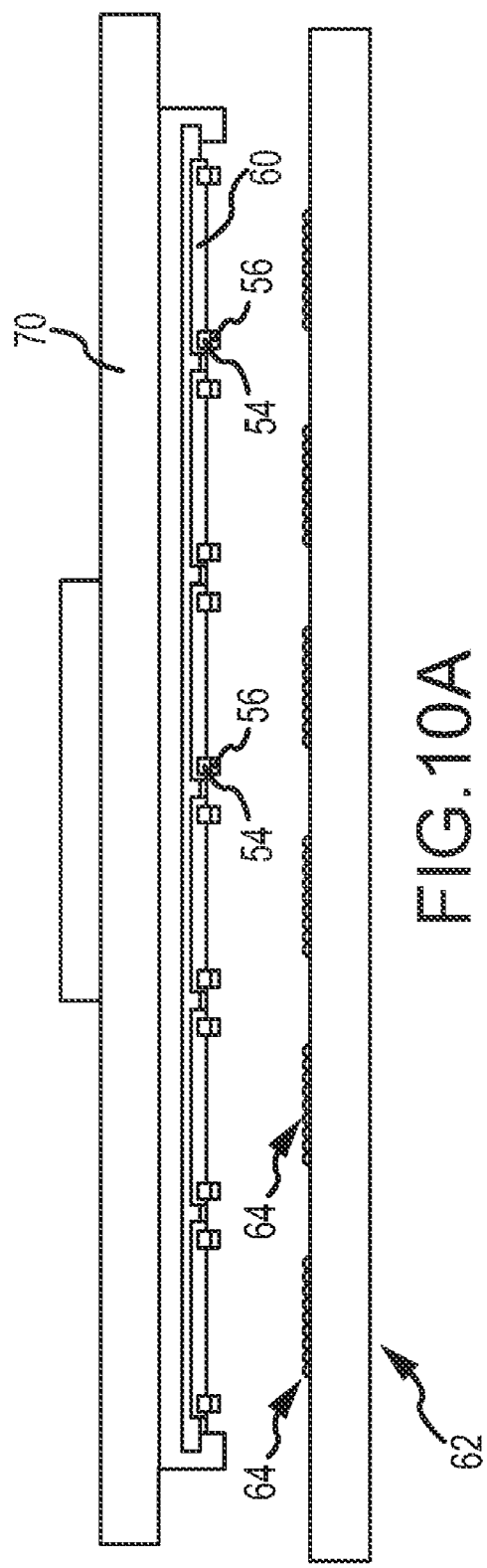
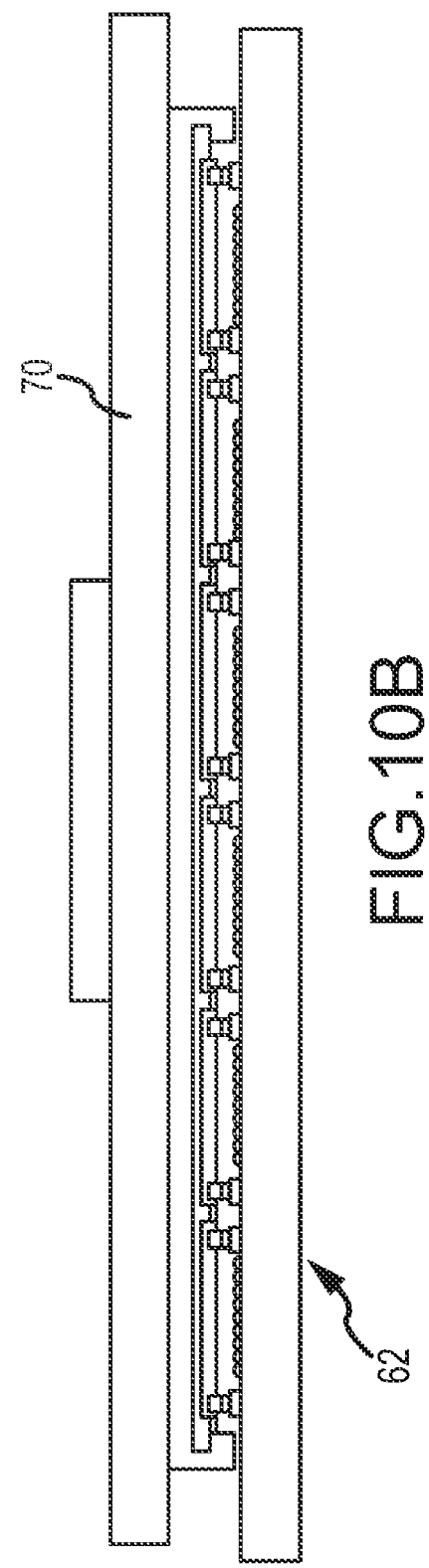
FIG. 10A
FIG. 10B

TECHNIQUES FOR GLASS ATTACHMENT IN AN IMAGE SENSOR PACKAGE

This application claims priority as a continuation from U.S. patent application Ser. No. 12/343,985, entitled "Techniques For Glass Attachment In An Image Sensor Package" filed on Dec. 24, 2008, which is a continuation-in-part from U.S. patent application Ser. No. 12/136,033, entitled "Glass-On-Die Attachment Method For Image Sensors," filed Jun. 9, 2008, which claims priority from U.S. Provisional Patent Application No. 60/942,953 entitled "Glass-On-Die Attachment Method For Image Sensors," filed Jun. 8, 2007, the entire contents of each of which are incorporated by reference herein.

BACKGROUND

The following relates generally to a wafer level packaging (WLP) method for the attachment of glass to a wafer substrate before dicing, and more particularly to a low-cost method to package a CMOS or CCD type image-sensor thereby protecting it from particulate contamination and stress-damage during assembly.

Particle contamination of the microlens or image-sensor during the assembly of microelectronic optical modules can cause the modules to fail. Particles account for as much as ninety percent of the yield loss during the camera module assembly process. With higher resolution devices, the yield loss due to particles increases with smaller pixel sizes. For example, in a 3 Megapixel sensor, the pixel size is less than 2 microns. If a particle may block no more than one pixel before causing deterioration in image quality, then the maximum allowable particle size in this application would be constrained to 2 microns in diameter. In order to limit the number of particles of this dimension, strict particle control measures would be needed during the camera module assembly process to avoid yield loss. These particle containment measures would increase the cost of the assembly operation.

WLP processes help address the contamination issue over existing Chip-on-Board (COB) technology methods. This yield improvement is achieved by protecting the sensor's active area from contamination, using a glass layer, prior to singulation of the wafer and mounting of the device. Since particles that land on the top surface of the glass/lens would be separated from the sensor by the thickness of the glass layer (typically, 0.3 to 0.4 mm), the maximum allowable particle size can be as great as 25 µm in diameter before it causes image deterioration. Also, any units that fail to perform due to particle contamination of the glass surface may be easily recovered by rework. The yield of the camera module assembly process could thus be improved significantly using a wafer level packaging method.

One WLP process that is currently in use (e.g., Tessera's Shellcase CF), bonds a wafer-sized glass plate on the top of cavity walls on the sensor side of the wafer thus creating an optical cavity over each sensor. This step is followed by glass singulation and back-grinding of the wafer. Finally, the wafer is singulated into individual devices. While this process has shown improvement in yield over COB processes, it may generate high stress on the circuitry inside the silicon, which may give rise to yield loss.

Another WLP process (e.g., Schott OPTO-WLP) also shows some advantages in yield management. The first step in this process is the protection of sensitive active structures by a glass cover. A specialized adhesive wafer bonding process enables selective coverage of the adhesive within the bond layer. In the next step, the bonded silicon-glass sandwich is thinned from the silicon side (backside). The next steps involve etching vias into the silicon side to open the bond pads to the back of the wafer, redistribution of the contacts to the backside of the wafer and ball attachment. The process thus needs via/street formation, multiple layers of leads/insulation material and many of the process steps heavily rely on manual trial and error methods. As a result, the lead-time is quite long and process instability may result, when using this process.

It is against this background that the present invention has been developed.

SUMMARY

The following embodiments and aspects of thereof are described and illustrated in conjunction with other systems, tools, and methods which are meant to be exemplary and illustrative and are not limiting in scope. In various embodiments, one or more of the above-described problems has been reduced or eliminated, while other embodiments are directed to other improvements.

A wafer level packaging process for a semiconductor image-sensor device includes temporarily mounting a substantially wafer-sized glass plate onto a glass wafer fixture; singulating the glass plate to create singulated glass die that generally correspond to a pattern on a processed wafer having a plurality of fabricated optical image-sensors; attaching cavity walls to the glass; aligning the glass wafer fixture to the processed wafer so that the singulated glass die with the cavity walls are generally aligned with the pattern of the image-sensors on the processed wafer; bonding the cavity walls of the singulated glass die to the optical image-sensors with an adhesive to create a sensor-cavity wall-glass sandwich with an internal cavity; and releasing the singulated glass die from the glass wafer fixture.

The temporary mounting of the glass wafer to the glass wafer fixture may be accomplished by dispensing a pattern of curable adhesive that generally corresponds to the image-sensor pattern on the device wafer. The bonding step may include application of adhesive to the singulated glass die. The bonding step may include application of adhesive to the image-sensor surface. The adhesive may be a UV-curable optical adhesive. The bonding step may include exposing the device-cavity wall-glass sandwich to UV light to cure the adhesive. The bonding process may include setting the distance between the image-sensor and the glass cover.

The sensor-cavity wall-glass sandwich may be diced to create individual devices before releasing the structure from the glass wafer fixture. The sensor-cavity wall-glass sandwich may be diced to create individual devices after releasing the structure from the glass wafer fixture. The step of singulating the glass plate may include the additional step of providing a taper along the thickness dimension of the glass. The step of releasing the singulated glass die may include exposing the adhesive holding the glass die to the glass fixture to UV light. The cavity walls may be attached to the glass plate prior to singulation. The cavity walls may be attached to the singulated glass die after singulation. The glass wafer fixture may include a metal frame carrier supporting a film with adhesive thereon.

A wafer level packaging process for a semiconductor image-sensor device includes temporarily mounting a substantially wafer-sized glass plate onto a glass wafer fixture; attaching cavity walls to the glass plate; singulating the glass plate to create singulated glass die, each having cavity walls, that generally correspond to a pattern on a processed wafer having a plurality of fabricated optical image-sensors; aligning the glass wafer fixture to the processed wafer so that the singulated glass die with the cavity walls are generally aligned with the pattern of the image-sensors on the processed wafer; bonding the cavity walls of the singulated glass die to the optical image-sensors with an adhesive to create a sensor-cavity wall-glass sandwich with an internal cavity; and releasing the singulated glass die from the glass wafer fixture.

The cavity walls may be attached to the glass plate before mounting the plate on the glass plate fixture. The cavity walls may be attached to the glass plate after mounting the plate on the glass plate fixture. The glass plate fixture may include a metal frame carrier supporting a film with adhesive thereon.

A wafer level packaging process for a semiconductor image-sensor device includes temporarily mounting a substantially wafer-sized glass plate onto a glass wafer fixture; singulating the glass plate to create singulated glass die that generally correspond to a pattern on a processed wafer having a plurality of fabricated optical image-sensors; attaching cavity walls to the processed wafer; aligning the glass wafer fixture to the processed wafer so that the singulated glass die are generally aligned with the pattern of the image-sensors on the processed wafer with the cavity walls; bonding the singulated glass die to the cavity walls associated with the optical image-sensors with an adhesive to create a sensor-cavity wall-glass sandwich with an internal cavity; and releasing the singulated glass die from the glass wafer fixture.

A wafer level packaging process for a semiconductor image-sensor device includes temporarily mounting a substantially wafer-sized glass plate onto a glass wafer fixture; singulating the glass plate to create singulated glass die that generally correspond to a pattern on a processed wafer having a plurality of fabricated optical image-sensors; aligning the glass wafer fixture to the processed wafer so that the singulated glass die are generally aligned with the pattern of the image-sensors on the processed wafer; bonding the singulated glass die to the optical image-sensors with an adhesive to create a sensor-adhesive-glass sandwich; and releasing the singulated glass die from the glass wafer fixture.

The temporary mounting of the glass wafer to the glass wafer fixture may be accomplished by dispensing a pattern of curable adhesive that generally corresponds to the image-sensor pattern on the device wafer. The bonding step may include application of adhesive to the singulated glass die. The bonding step may include application of adhesive to the image-sensor surface. The adhesive may be a UV-curable optical adhesive. The bonding step may include exposing the device-adhesive-glass sandwich to UV light to cure the adhesive. The bonding process may include setting the distance between the image-sensor and the glass cover. The sensor-adhesive-glass sandwich may be diced to create individual devices before releasing the structure from the glass wafer fixture. The sensor-adhesive-glass sandwich may be diced to create individual devices after releasing the structure from the glass wafer fixture. The step of singulating the glass plate may include the additional step of providing a taper along the thickness dimension of the glass. The step of releasing the singulated glass die may include exposing the adhesive holding the glass die to the glass fixture to UV light.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein be considered illustrative rather than limiting.

FIG. 1A is a sectional view illustrating an attachment step wherein a wafer-sized glass is attached to a glass wafer fixture on a glass wafer transport.

FIG. 1B shows the adhesive pattern applied to the glass wafer fixture to hold the glass wafer.

FIGS. 3A and 3B illustrate sectional views of the inverted glass wafer transport, with the glass wafer fixture and the singulated glass wafer in opposing relationship to a CMOS wafer having a plurality of image-sensor devices.

FIG. 3A illustrates one embodiment where the adhesive is applied to the image sensors.

FIG. 3B illustrates another embodiment where the adhesive is applied to the singulated glass die.

FIG. 4 illustrates a sectional view of the attachment step of the flipped singulated glass die after they are aligned to the CMOS image-sensor wafer.

FIG. 5 illustrates a sectional view of the release step wherein the bonded CMOS wafer and glass wafer are released from the glass wafer fixture.

FIG. 8 is a perspective view of the glass wafer of FIG. 7 being singulated with a saw.

FIGS. 10A and 10B show the use of a glass support fixture in the attachment of the singulated glass to the image sensor wafer with a plurality of cavity walls.

DETAILED DESCRIPTION

Figure 2B:
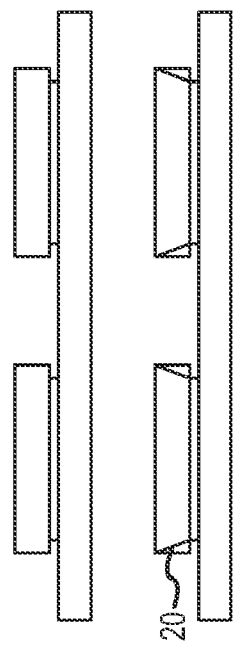
FIG. 2B shows an optional step of providing a taper to the singulated glass die.

Reference will now be made to the accompanying drawings, which assist in illustrating the various pertinent features of the present invention. Although the present invention will now be described primarily as a process to attach glass to an image-sensor package, it should be expressly understood that the present invention might be applicable to other wafer level packaging applications where a glass attachment is required/desired. Alternatively, the material selection is not restricted to glass hut may be expanded beyond glass to any transparent or partially transparent material with properties such as anti-reflection, static-resistance, and light filtering. In this regard, the following description of a process to attach glass to an image-sensor package is presented for purposes of illustration and description. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

The inventors understand that with WLP methods such as the Shellcase CF packaging where the glass is singulated after attaching it to the device wafer, there may be potential for device damage. This damage may be due to mechanical stresses induced during backgrinding of the wafer or singulation of the glass after attachment to the device wafer. In addition, the image-sensor devices may be damaged due to electrostatic discharge caused by the build-up of static during the process of singulating the glass. Another possible failure method may involve contamination of the electrical pads by glass debris generated during the step of singulating the glass wafer. The proposed methods are aimed at addressing these and other deficiencies.

The proposed WLP method for a microelectronic image-sensor device includes steps to attach a thin singulated glass plate on the wafer substrate at the start of the device packaging process. The glass cover provides support to the device during the die singulation step of wafer fabrication. In addition, the glass cover would prevent particles from the ambient environment from becoming embedded into the microlens or the imaging device.

One embodiment of the glass attachment method relates to applications with image-sensors (and microlenses) fabricated on a wafer. A glass wafer 10 (e.g., 400 µm thickness) is first temporarily mounted to a glass wafer fixture 12 (which may be transparent) assembled on a glass wafer transport 14 as shown in FIG. 1A. The temporary mounting may be achieved through the use of a matrix 16 of dicing tape (that may be curable using ultraviolet (UV) light), as shown in FIG. 1B. The temporary mounting may also be accomplished using other adhesive materials. The pattern of the dicing tape matches the die pattern of the image-sensor wafer, though it may be fabricated such that it has wider streets than the image-sensor wafer. In other words, each adhesive dice has a scaled-down footprint of the corresponding image-sensor dice.

Figure 2A:
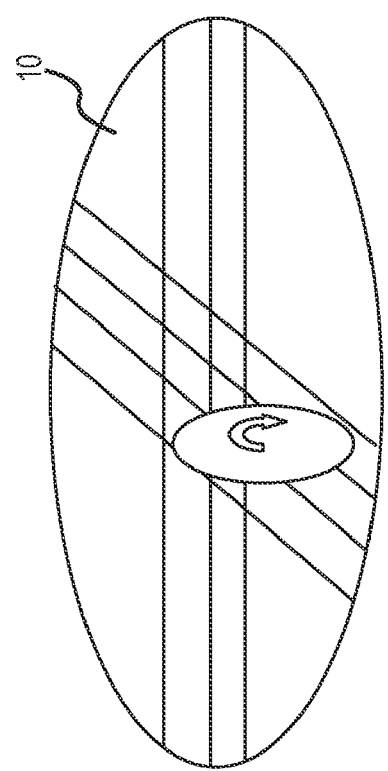
FIG. 2A shows the glass wafer being singulated into predetermined shapes using a sawing device.
Figure 2C:
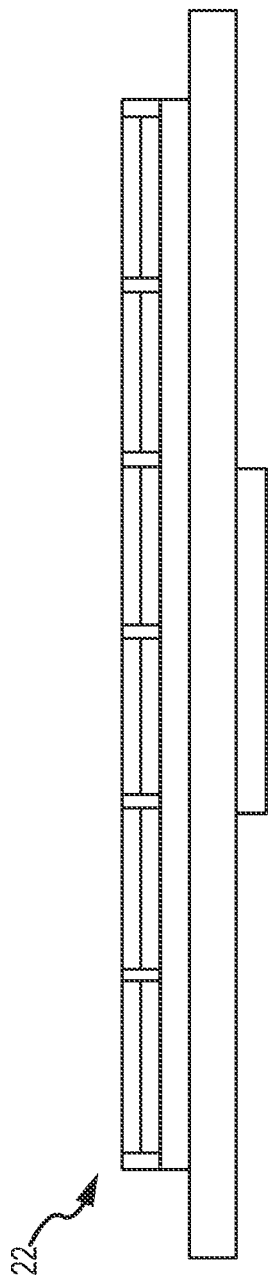
FIG. 2C shows a sectional view of the singulated glass wafer attached to the fixture.

The glass wafer 10 is then singulated (to match the die pattern on the image-sensor wafer) as shown in FIGS. 2A and 2C. Here, the glass pattern may be fabricated such that it has narrower streets than the image-sensor wafer. In other words, each glass dice has a scaled-up footprint of an mage-sensor dice, such that it exceeds the dimensions of the image-sensor but does not overlay the electrical contact pads for the image-sensor device. Additionally, the edges 20 of the cover may be tapered slightly inwards as shown in FIG. 2B so that the face bonded to the image-sensor is larger than the opposite face.

After the singulated glass is cleaned, the glass wafer transport and the glass wafer fixture holding the singulated glass (collectively shown as 22) are inverted and aligned so that the exposed face of the singulated glass faces the image sensor wafer 24 and mirrors the pattern of the image-sensor devices on the wafer as shown in FIGS. 3A and 3B. Creating slightly oversized covers makes this alignment step less sensitive to placement or alignment errors. Optical adhesive 26 is selectively applied to the device wafer 24 such that it coats each optical image-sensor and its corresponding microlens (if applicable) leaving the surrounding electrical contacts uncovered, as shown in FIG. 3A. One aspect of the process includes controlling how the adhesive is dispensed (patterns and quantity) and selection of the adhesive to minimize defects such as microbubbles that may degrade the quality of the image captured by the image-sensor. Additionally, the adhesive may also be required to be heat and moisture tolerant, since the adhesive will eventually come in contact with the external environment.

In another embodiment, the optical adhesive 26 is applied to the singulated glass rather than the image-sensor/lens combination, and then the glass die are bonded with the image-sensor wafer 24 as shown in FIG. 3B. A method such as spin-coating can be employed to apply the adhesive 26 to the singulated glass die. Since optical adhesive is expensive and this process may consume more adhesive, improvements could potentially be made to this process to make it more economical.

The singulated glass wafer is then bonded to the image-sensor wafer (collectively 30) as shown in FIG. 4, without a cavity therebetween. Certain dimensions of the adhesive application and bonding process might include fixing the distance of the glass from the image-sensor surface, and creating a glass/image-sensor sandwich within specified limits of parallelism. The sandwiched structure 30 is released from the glass wafer fixture 12 as shown in FIG. 5. The curing of the adhesive and the release of the sandwiched structure 30 from the glass wafer fixture 12 may be accomplished in the same step by a judicious selection of UV wavelengths or particular temperatures and exposure times.

Figure 6A:
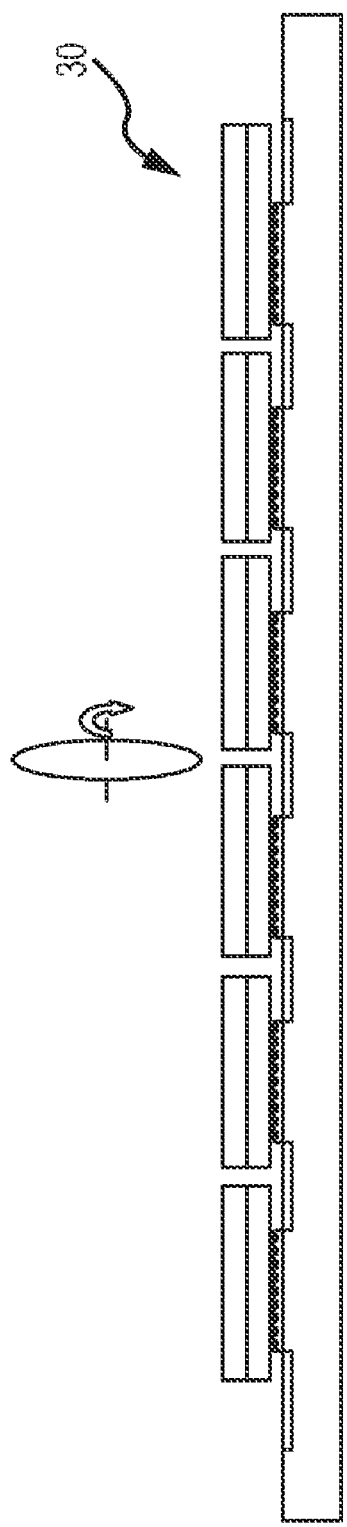
FIG. 6A illustrates a sectional view of the singulation step in one embodiment wherein the glass-bonded CMOS image-sensor devices are separated using a die cutter after being released from the glass wafer fixture.
Figure 6B:
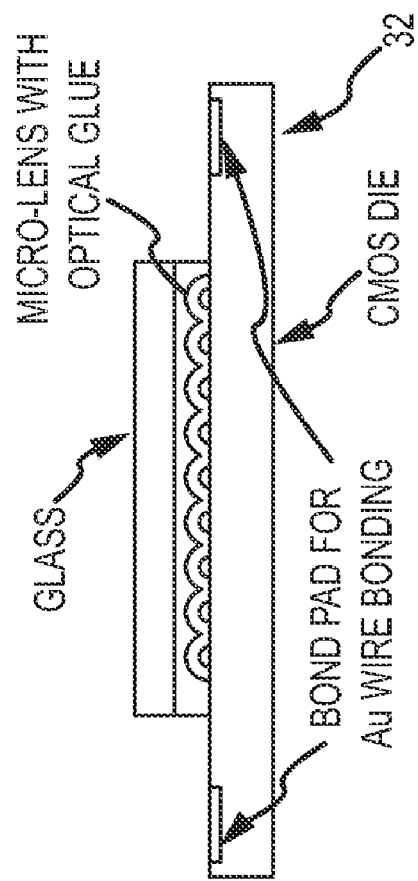
FIG. 6B shows a sectional view of a singulated image-sensor with glass bonded to the sensor.

The optical image-sensor wafer structure 30 is then diced using the glass die for support as shown in FIG. 6A. In an alternate embodiment, the dicing might be accomplished before the sandwich structure is released from the glass wafer fixture. A representative image-sensor 32 with the protective glass covering is shown in FIG. 6B. This method of wafer level packaging is believed to be a lower cost alternative to the existing wafer level packaging processes in use in the industry.

Figure 7:
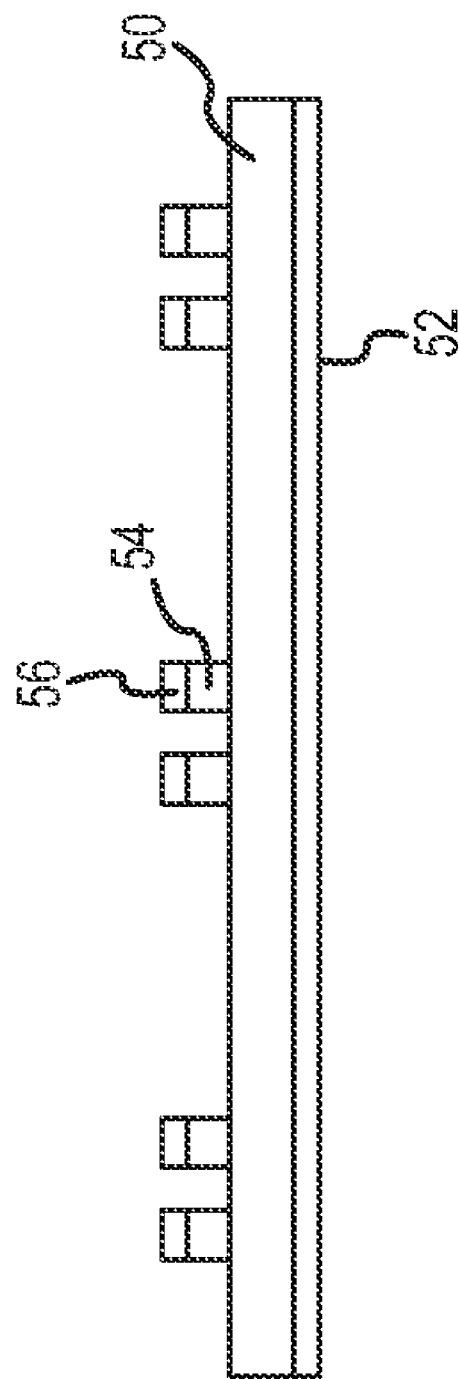
FIG. 7 is a sectional view of an alternative embodiment showing a portion of a wafer-sized glass attached to UV dicing tape and having cavity walls attached to an opposite side of the glass.

Alternatively, a cover glass can be attached to an image sensor via cavity walls to create an internal cavity as shown in FIGS. 7-13. As shown in FIG. 7, a sheet of glass 50 has UV dicing tape 52 applied to one side thereof. On an opposite side of the glass sheet 50, a plurality of cavity walls 54 are attached. The cavity walls may be die cut from LE tap, A layer of epoxy 56 is applied to the top surface of each of the cavity walls 54.

Figure 7A:
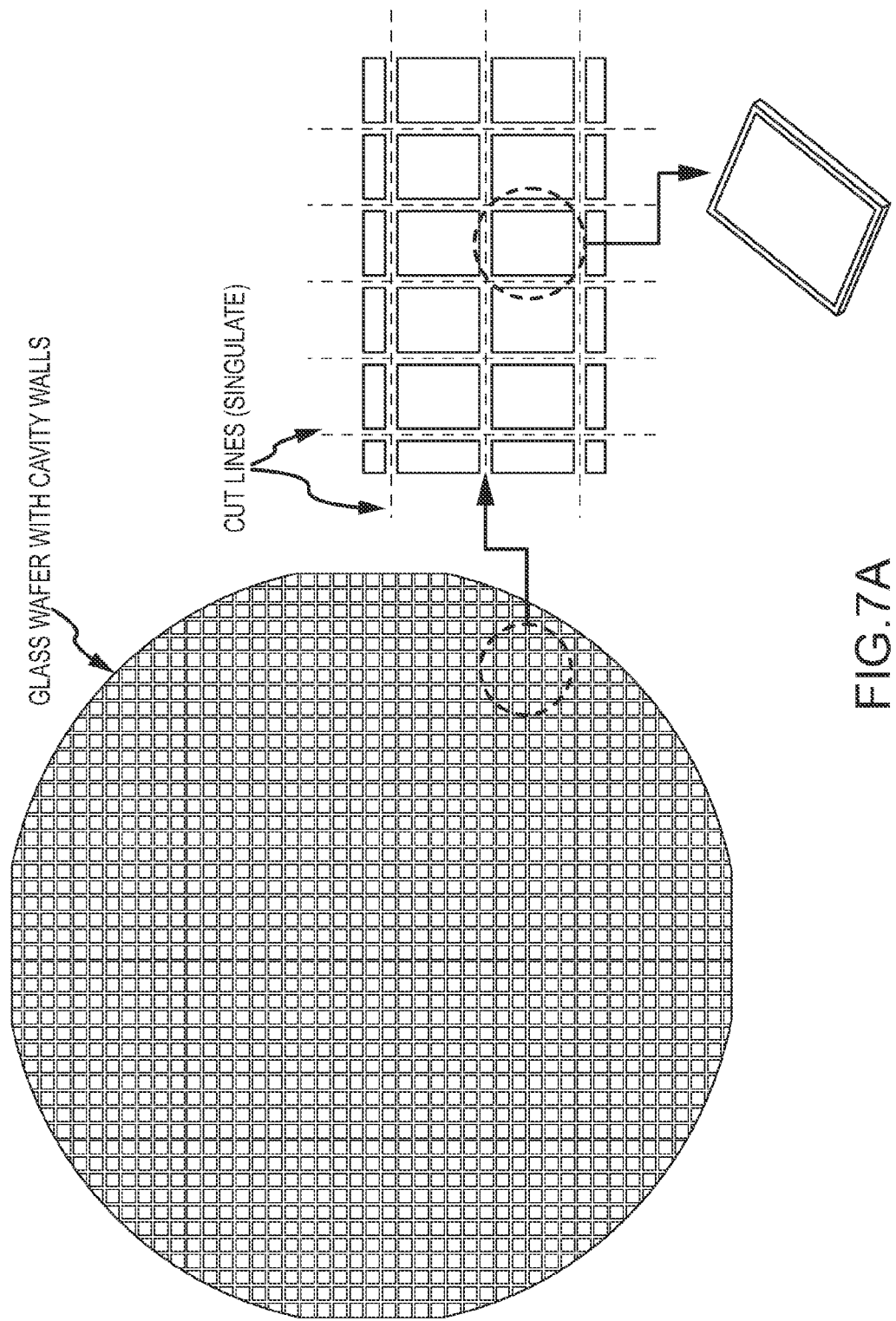
FIG. 7A is a perspective view of a glass wafer with adhesive film forming cavity walls.

As shown in FIG. 7A, the cavity walls 54 may be formed by using adhesive film which is attached to the glass plate prior to singulation.

Figure 9:
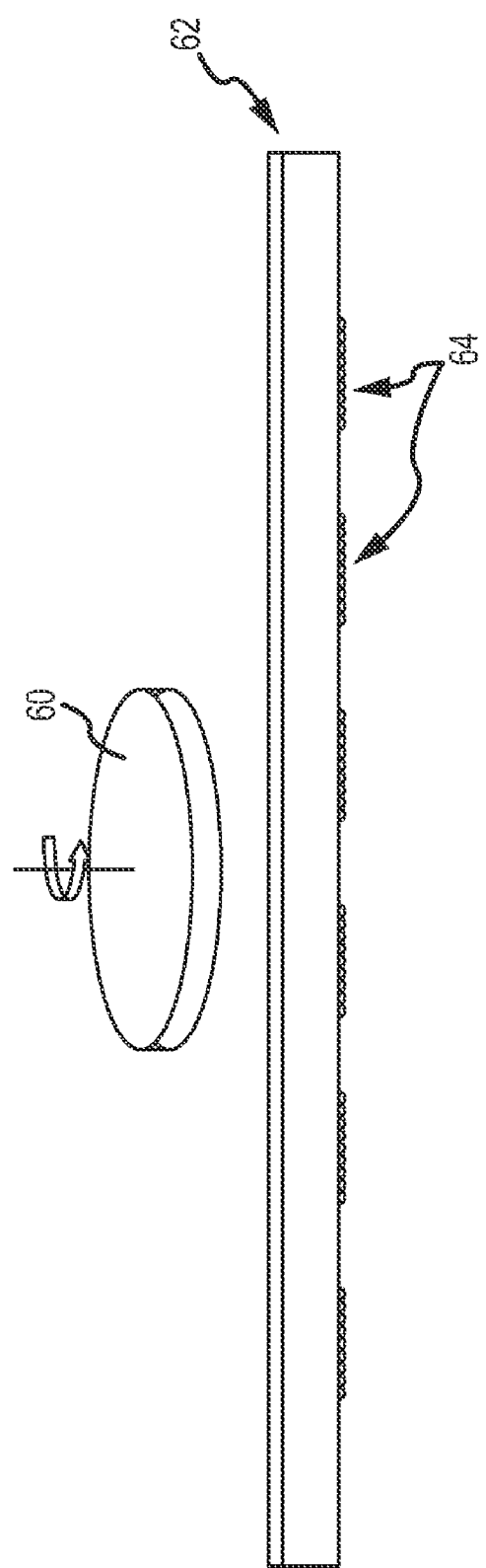
FIG. 9 is an illustration of a back-grinding step where a wafer having a plurality of image sensors is back grinded.

Next, as shown in FIG. 8, the glass sheet 50 is singulated with a dicing saw 58 into multiple singulated glass die 60 which are held together by the UV dicing tape 52. Meanwhile, as shown in FIG. 9, a silicon wafer 62 (having a plurality of individual image sensors 64 formed thereon) is ground with a grinder 66 from a back side thereof to back-grind the silicon wafer 62 to a desired thickness. Since this back-grinding operation is performed on the silicon wafer 62, it can be performed before, during, or after the steps of applying the cavity walls 54 to the glass sheet 50 and singulating the glass sheet 50.

Following this, as shown in FIG. 10A, the singulated glass die 60 having the cavity walls 54 thereon can be aligned with the individual image sensors 64 on the silicon wafer 62. The singulated glass die 60 are held in alignment with the silicon wafer 62 by a glass fixture 70. The glass fixture 70 can be temporarily attached to the glass sheet 50 prior, during, or after the application of the cavity walls 54 and singulation into separate glass die 60. As shown in FIG. 10B, the glass fixture 70 and the silicon wafer 62 are moved relative to each other to bring the epoxy 56 on the cavity walls 54 into contact with the silicon wafer 62 at locations surrounding the individual image sensors 64. This action bonds the cavity walls 54 to the silicon wafer 62.

Figure 11:
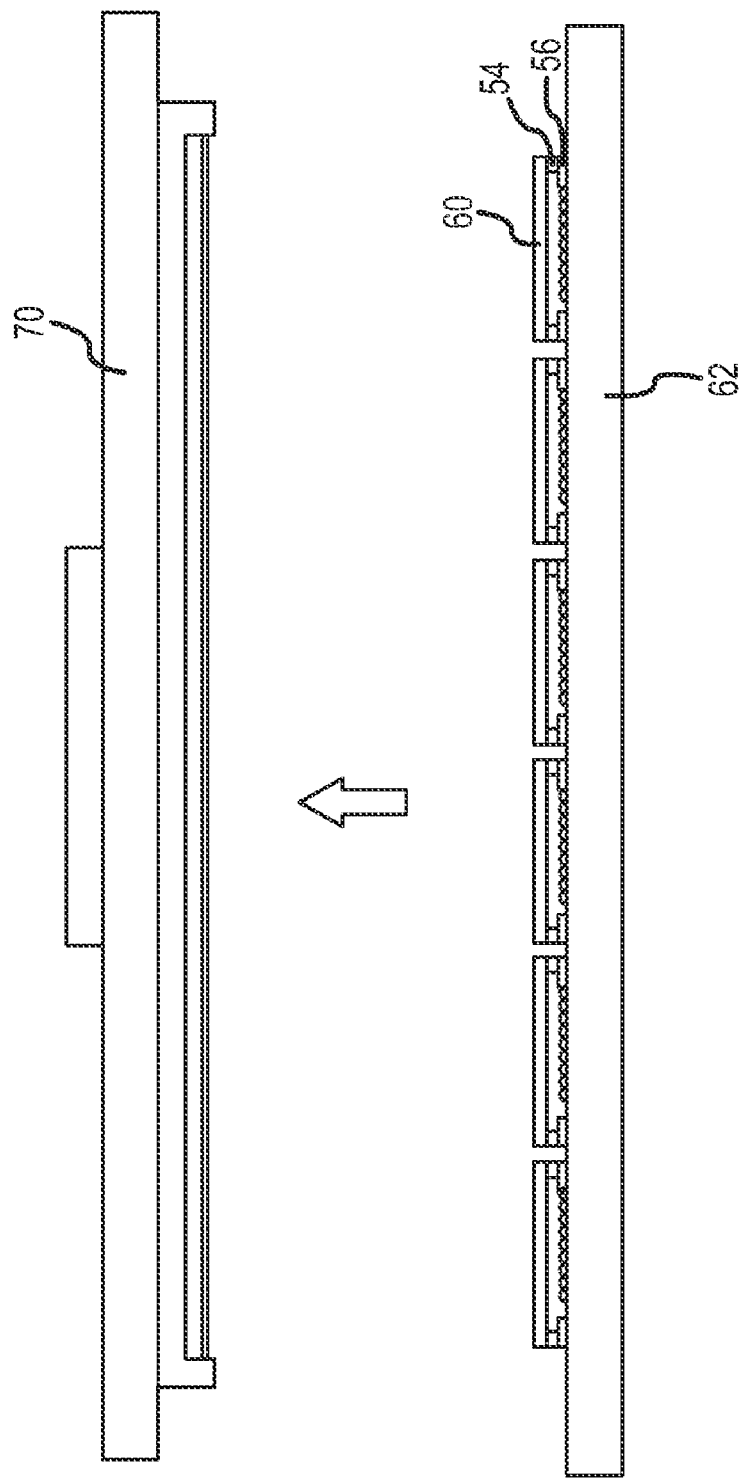
FIG. 11 show a release step where the glass support fixture releases the singulated glass.
Figure 12:
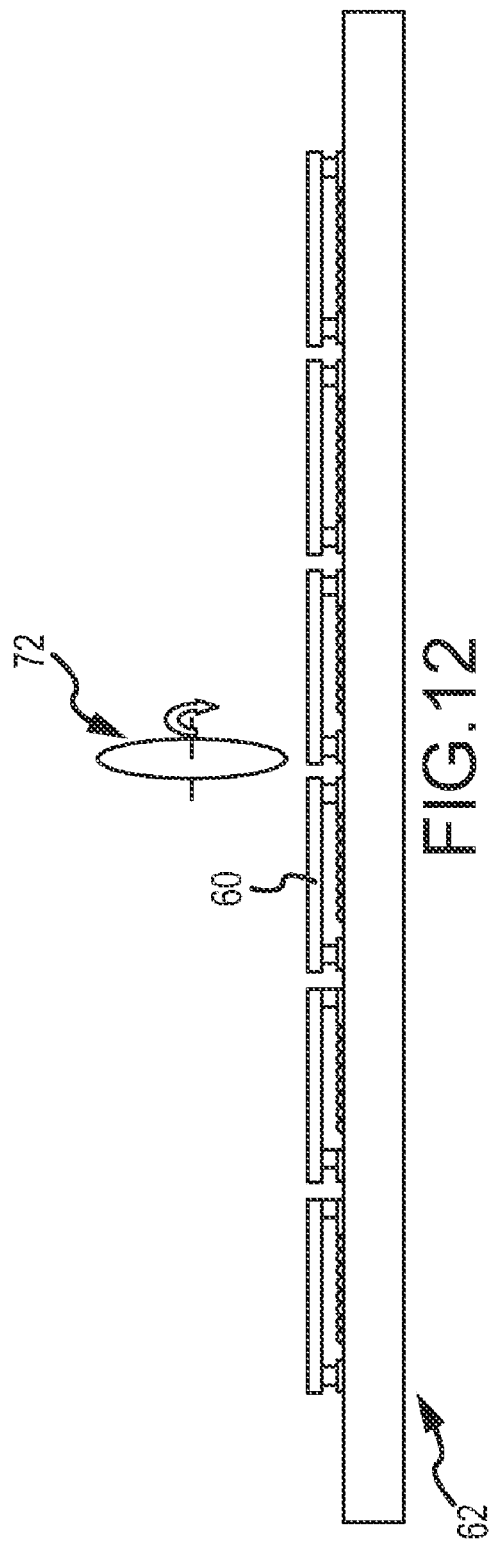
FIG. 12 shows a wafer singulation step.
Figure 13:
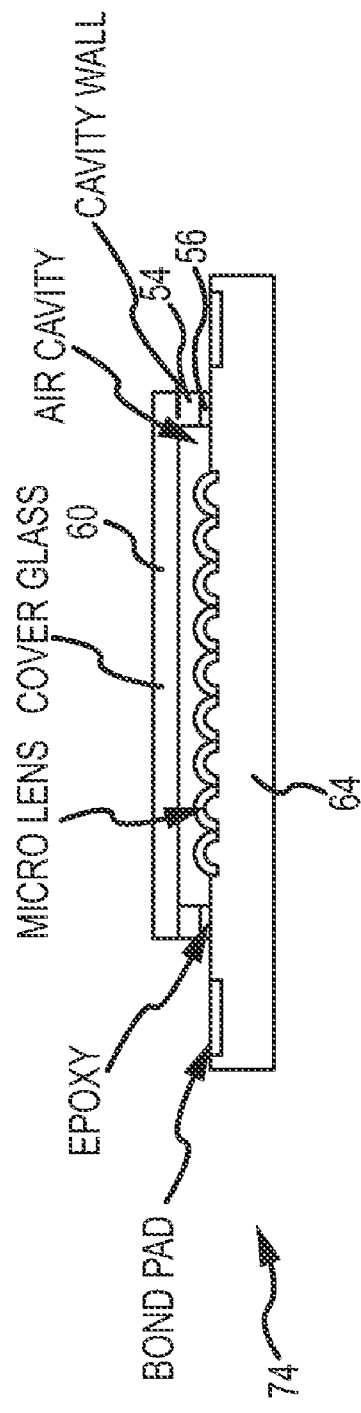
FIG. 13 is a sectional side view of a singulated image sensor package having a cover glass separated from an image sensor substrate by a plurality of cavity walls.

In order to release the glass fixture 70 from the assembly, a UV light source (not shown) provides UV light that causes the glass fixture 70 to release the singulated glass die 60, as shown in FIG. 11. The outer surfaces of the singulated glass dies 60 can now be cleaned (not shown). Next, the same or a different dicing saw 72 is used to saw through the silicon wafer 62 at locations outside of the cavity walls 54 and between the individual singulated glass die 60, as shown in FIG. 12. In this manner, the silicon wafer 62 is separated into individual image sensor packages 74, one of which is shown in FIG. 13.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. A wafer level packaging processing for a semiconductor image-sensor device, comprising:
    temporarily mounting a substantially wafer-sized glass plate onto a glass wafer fixture;
    singulating the glass plate to create singulated glass die that generally correspond to a pattern on a processed wafer having a plurality of fabricated optical image-sensors;
    attaching cavity walls to the glass;
    aligning the glass wafer fixture to the processed wafer so that the singulated glass die with the cavity walls are generally aligned with the pattern of the image-sensors on the processed wafer;
    bonding the cavity walls of the singulated glass die to the optical image-sensors with an adhesive to create a sensor-cavity wall-glass sandwich with an internal cavity; and
    releasing the singulated glass die from the glass wafer fixture.

2. The process of claim 1, wherein the temporary mounting of the glass wafer to the glass wafer fixture is accomplished by dispensing a pattern of curable adhesive that generally corresponds to the image-sensor pattern on the device wafer.

3. The process of claim 1, wherein the bonding step includes application of adhesive to the singulated glass die.

4. The process of claim 1, wherein the bonding step includes application of adhesive to the image-sensor surface.

5. The process of claim 1, wherein the adhesive is a UV-curable optical adhesive.

6. The process of claim 5, wherein the bonding step includes exposing the device-cavity wall-glass sandwich to UV light to cure the adhesive.

7. The process of claim 1, wherein the bonding process includes setting the distance between the image-sensor and the glass cover.

8. The process of claim 1, wherein the sensor-cavity wall-glass sandwich is diced to create individual devices before releasing the structure from the glass wafer fixture.

9. The process of claim 1, wherein the sensor-cavity wall-glass sandwich is diced to create individual devices after releasing the structure from the glass wafer fixture.

10. The process of claim 1, wherein the step of singulating the glass plate includes the additional step of providing a taper along the thickness dimension of the glass.

11. The process of claim 1, wherein the step of releasing the singulated glass die includes exposing the adhesive holding the glass die to the glass fixture to UV light.

12. The process of claim 1, wherein the cavity walls are attached to the glass plate prior to singulation.

13. The process of claim 1, wherein the cavity walls are attached to the singulated glass die after singulation.

14. The process of claim 1, wherein the glass wafer fixture includes a metal frame carrier supporting a film with adhesive thereon.

15. A wafer level packaging process for a semiconductor image-sensor device, comprising:
    temporarily mounting a substantially wafer-sized glass plate onto a glass wafer fixture;
    attaching cavity walls to the glass plate;
    singulating the glass plate to create singulated glass die, each having cavity walls, that generally correspond to a pattern on a processed wafer having a plurality of fabricated optical image-sensors;
    aligning the glass wafer fixture to the processed wafer so that the singulated glass die with the cavity walls are generally aligned with the pattern of the image-sensors on the processed wafer;
    bonding the cavity walls of the singulated glass die to the optical image-sensors with an adhesive to create a sensor-cavity wall-glass sandwich with an internal cavity; and
    releasing the singulated glass die from the glass wafer fixture.

16. The process of claim 15, wherein the cavity walls are attached to the glass plate before mounting the plate on the glass plate fixture.

17. The process of claim 15, wherein the cavity walls are attached to the glass plate after mounting the plate on the glass plate fixture.

18. The process of claim 15, wherein the glass plate fixture includes a metal frame carrier supporting a film with adhesive thereon.

19. A wafer level packaging process for a semiconductor image-sensor device, comprising:
    temporarily mounting a substantially wafer-sized glass plate onto a glass wafer fixture;
    singulating the glass plate to create singulated glass die that generally correspond to a pattern on a processed wafer having a plurality of fabricated optical image-sensors;
    attaching cavity walls to the processed wafer;
    aligning the glass wafer fixture to the processed wafer so that the singulated glass die are generally aligned with the pattern of the image-sensors on the processed wafer with the cavity walls;
    bonding the singulated glass die to the cavity walls associated with the optical image-sensors with an adhesive to create a sensor-cavity wall-glass sandwich with an internal cavity; and
    releasing the singulated glass die from the glass wafer fixture.

20. The process of claim 19, wherein the glass wafer fixture includes a metal frame carrier supporting a film with adhesive thereon.

21. A wafer level packaging process for a semiconductor image-sensor device, comprising:
   temporarily mounting a substantially wafer-sized glass plate onto a glass wafer fixture;
   singulating the glass plate to create singulated glass die that generally correspond to a pattern on a processed wafer having a plurality of fabricated optical image-sensors;
   aligning the glass wafer fixture to the processed wafer so that the singulated glass die are generally aligned with the pattern of the image-sensors on the processed wafer;
   bonding the singulated glass die to the optical image-sensors with an adhesive to create a sensor-adhesive-glass sandwich;
   releasing the singulated glass die from the glass wafer fixture.

22. The process of claim 21, wherein the temporary mounting of the glass wafer to the glass wafer fixture is accomplished by dispensing a pattern of curable adhesive that generally corresponds to the image-sensor pattern on the device wafer.

23. The process of claim 21, wherein the bonding step includes application of adhesive to the singulated glass die.

24. The process of claim 21, wherein the bonding step includes application of adhesive to the image-sensor surface.

25. The process of claim 21, wherein the adhesive is a UV-curable optical adhesive.

26. The process of claim 25, wherein the bonding step includes exposing the device-adhesive-glass sandwich to UV light to cure the adhesive.

27. The process of claim 21, wherein the bonding process includes setting the distance between the image-sensor and the glass cover.

28. The process of claim 21, wherein the sensor-adhesive-glass sandwich is diced to create individual devices before releasing the structure from the glass wafer fixture.

29. The process of claim 21, wherein the sensor-adhesive-glass sandwich is diced to create individual devices after releasing the structure from the glass wafer fixture.

30. The process of claim 21, wherein the step of singulating the glass plate includes the additional step of providing a taper along the thickness dimension of the glass.

31. The process of claim 21, wherein the step of releasing the singulated glass die includes exposing the adhesive holding the glass die to the glass fixture to UV light.

\* \* \* \* \*

UNITED STATES PATENT AND TRADEMARK OFFICE
CERTIFICATE OF CORRECTION

| | | |
|---|---|---|
| PATENT NO. | : 8,093,092 B2 | Page 1 of 1 |
| APPLICATION NO. | : 12/502924 | |
| DATED | : January 10, 2012 | |
| INVENTOR(S) | : Singh et al. | |

It is certified that error appears in the above-identified patent and that said Letters Patent is hereby corrected as shown below:

Column 5, line 50, delete "mage-sensor" and insert therefor --image-sensor--.

Signed and Sealed this
Twenty-eighth Day of February, 2012

David J. Kappos
*Director of the United States Patent and Trademark Office*